(12) United States Patent
Pipilos

(10) Patent No.: US 7,372,925 B2
(45) Date of Patent: May 13, 2008

(54) WIRELESS LAN RECEIVER WITH I AND Q RF AND BASEBAND AGC LOOPS AND DC OFFSET CANCELLATION

(75) Inventor: Spyros Pipilos, Athens (GR)

(73) Assignee: Theta Microelectronics, Inc., San Jose, CA (US)

( * ) Notice: Subject to any disclaimer, the term of this patent is extended or adjusted under 35 U.S.C. 154(b) by 710 days.

(21) Appl. No.: 10/864,140

(22) Filed: Jun. 9, 2004

(65) Prior Publication Data

US 2005/0276358 A1 Dec. 15, 2005

(51) Int. Cl.
*H04L 27/08* (2006.01)
(52) U.S. Cl. ...................................... 375/345
(58) Field of Classification Search ................ 375/345, 375/317, 319, 340, 365; 455/314, 136, 226.1, 455/232.1, 324
See application file for complete search history.

(56) References Cited

U.S. PATENT DOCUMENTS

| | | | |
|---|---|---|---|
| 5,721,757 A | 2/1998 | Banh et al. | |
| 6,011,980 A | 1/2000 | Nagano et al. | |
| 6,654,593 B1 | 11/2003 | Simmons et al. | |
| 6,721,547 B2 | 4/2004 | Husted et al. | |
| 6,771,945 B1* | 8/2004 | Pickett et al. | 455/324 |
| 6,993,291 B2* | 1/2006 | Parssinen et al. | 455/67.11 |
| 7,212,798 B1* | 5/2007 | Adams | 455/251.1 |
| 2002/0042256 A1* | 4/2002 | Baldwin et al. | 455/232.1 |
| 2002/0183027 A1 | 12/2002 | Husted et al. | |
| 2003/0103581 A1 | 6/2003 | Rawlins et al. | |
| 2003/0114126 A1 | 6/2003 | Wang et al. | |
| 2003/0128776 A1 | 7/2003 | Rawlins et al. | |
| 2003/0161417 A1 | 8/2003 | Kluge et al. | |
| 2003/0169706 A1 | 9/2003 | Poegel et al. | |
| 2003/0202496 A1 | 10/2003 | Kluge et al. | |
| 2004/0004933 A1 | 1/2004 | Zhu et al. | |
| 2004/0005022 A1* | 1/2004 | Zhu et al. | 375/365 |
| 2004/0063417 A1* | 4/2004 | Binshtok et al. | 455/314 |
| 2004/0202102 A1* | 10/2004 | Kim et al. | 370/208 |
| 2005/0079837 A1* | 4/2005 | Koenig | 455/136 |
| 2006/0079191 A1* | 4/2006 | Parssinen et al. | 455/226.1 |

* cited by examiner

*Primary Examiner*—Chieh M. Fan
*Assistant Examiner*—Jaison Joseph
(74) *Attorney, Agent, or Firm*—Blakely Sokoloff Taylor & Zafman LLP

(57) ABSTRACT

A wireless local area network receiver having separate automatic gain control (AGC) loops for providing a radio frequency AGC and a baseband frequency AGC, as well as a DC offset cancellation circuit. The AGC loops control a low noise amplifier amplifying the received RF signal, and the baseband signal or signals from a mixer of I and Q mixers. The DC offset compensation loop is also responsive to the baseband AGC signal to maintain a substantially fixed gain in the DC offset compensation feedback. Details of various embodiments are disclosed, including embodiments for orthogonal frequency division multiplexing (OFDM) that provide the AGC operation and the DC offset cancellation to the desired levels within the relatively short period of a preamble that precedes the data transmission.

48 Claims, 6 Drawing Sheets

WIRELESS LAN RECEIVER WITH I AND Q RF AND BASEBAND AGC LOOPS AND DC OFFSET CANCELLATION

BACKGROUND OF THE INVENTION

1. Field of the Invention

The present invention relates generally to OFDM based wireless receivers, and more particularly to automatic gain control (AGC) and DC offset cancellation in a wireless receiver having a differential path.

2. Prior Art

Receivers are necessary components of communication links, and are used, for example, in two-way cellular phone communications and wireless local area networks. A simplified block diagram of a typical prior-art wireless receiver 100 having an inphase or "I" path and a quadrature or "Q" path is shown in FIG. 1. The "I" and "Q" paths are typical of a direct-conversion receiver which employ the two channels, commonly referred to as the "I" and "Q" paths. In such a receiver, a signal from an antenna is fed to low-noise amplifier (LNA) 110. LNA 110 is capable of a low or high gain, controlled through a baseband chip (not shown). LNA 110 is needed for the purpose of amplifying weak signals without introducing much noise. Furthermore, the gain of LNA 110 is not continuous, as it has only two gain settings, being externally controlled. An AGC circuit is connected from the output of a baseband amplifier (BBA), for example BBA 140-I, and its output connected to the amplification control signal of BBA 140-I. LNA 110 feeds a mixer 120, for example mixer 120-I, which mixes down the received high-frequency signal to the baseband (including 0 Hz), by effectively multiplying the received and then amplified signal with a local-oscillator (LO) signal produced by an oscillator (not shown), for example LO "I", in the receiver. The undesirable signals at very high frequencies produced by this process are filtered out by using a band pass filter BBF, for example BBF 130-I. The filtered signal is then amplified by a baseband amplifier (BBA), for example BBA 140-I, and is output as $V_I$ of the "I" channel. The gain of BBA 140-I is made variable through AGC action; the gain is made large when the received signal is small, and small when the received signal is large. The objective of this operation is to keep the output signal to a well-defined power so that it can be encoded by an analog-to-digital converter or otherwise used without undue distortion and noise. There is a symmetrical channel to provide the "Q" channel of the wireless receiver, the I and Q signals to the mixers being 90° out of phase.

A wireless receiver, operating for example in accordance with the IEEE 802.11a standard, uses orthogonal frequency division multiplexing (OFDM) with a preamble sequence 200 shown in FIG. 2. The preamble field is composed of ten repetitions of a "short training sequence" 210, used for AGC convergence, diversity selection, timing acquisition and DC offset cancellation in the receiver. The preamble field is further composed of two repetitions of a "long training sequence" 220, used for channel estimation and fine frequency acquisition, preceded by a guard interval 230. A short OFDM training symbol consists of 12 sub-carriers (±4, ±8, ±12, ±16, ±20 and ±24 with 312.5 KHz of spacing, for 802.11a and ±2, ±6, ±10, ±14, ±18 and ±22 with 312.5 KHz of spacing, for Hiperlan2). As there is no DC content in the spectral range but there is a DC offset error, this leads to an additional error in the AGC functionality. Specific operation of an AGC loop is well-known in the art and therefore a detailed analysis is not provided herein. Prior art solutions for AGC using frequency offset estimation methods first perform a coarse measure using the last few, usually three, short symbols of the first portion of the preamble. After that a second fine measure is performed, using the second portion of the preamble. The number of symbols used for coarse measurement is a compromise between the need to achieve maximum precision which requires a large number of symbols and the phase ambiguity where a larger estimation range must be used and therefore a small number of symbols. The resultant compromise is as described above, leading to a less accurate estimation of frequency offset, impacting the capability of the AGC.

In view of the limitations of prior art solution, it would be advantageous to provide means for an effective AGC for system 100, preferably less dependent on the number of symbols. It would be further advantageous if such AGC means would further control DC offset cancellation means without interfering with the AGC operation.

DETAILED DESCRIPTION OF THE PREFERRED EMBODIMENTS

In order to overcome the limitations of prior art solutions, there is disclosed a receiver having separate automatic gain control (AGC) units. One AGC unit is used for controlling the low-noise amplifier (LNA) amplification. A second AGC is used to control the amplification of the baseband amplifiers (BBAs). The AGC units receive their inputs from both the "I" and "Q" channels and provide a control voltage that is designed to control the amplification of the amplification unit under control of the respective AGC. By separating the AGCs into two units, a faster control over the desired amplification range is achieved. Furthermore, in one embodiment of the disclosed invention, the corner frequency of the AGC unit is changed to allow for coarse mode AGC at the beginning of the preamble period and a fine mode AGC at the later part of the preamble period.

Figure 1:
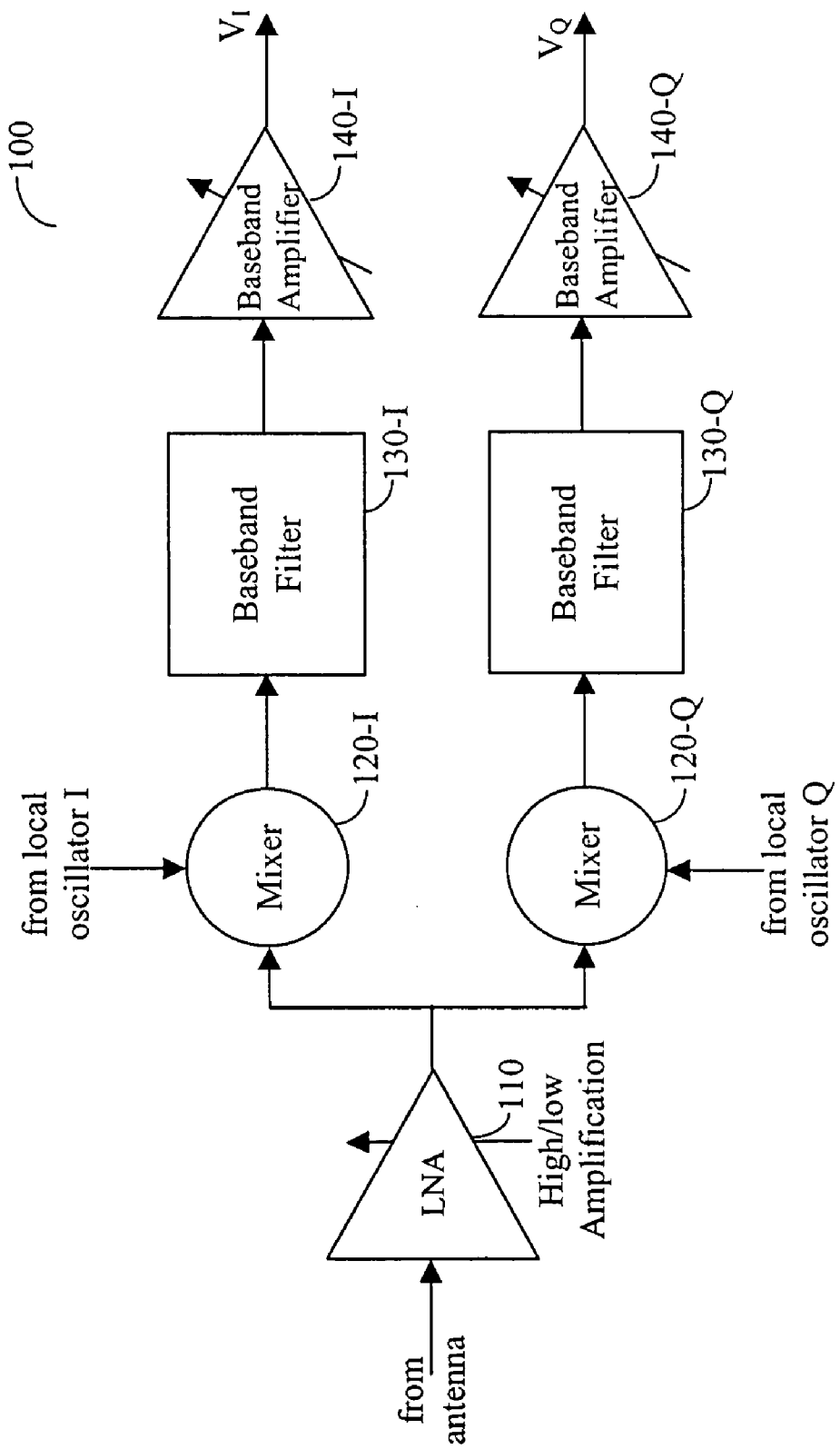
FIG. 1 is a schematic diagram of an exemplary prior art wireless receiver.
Figure 2:
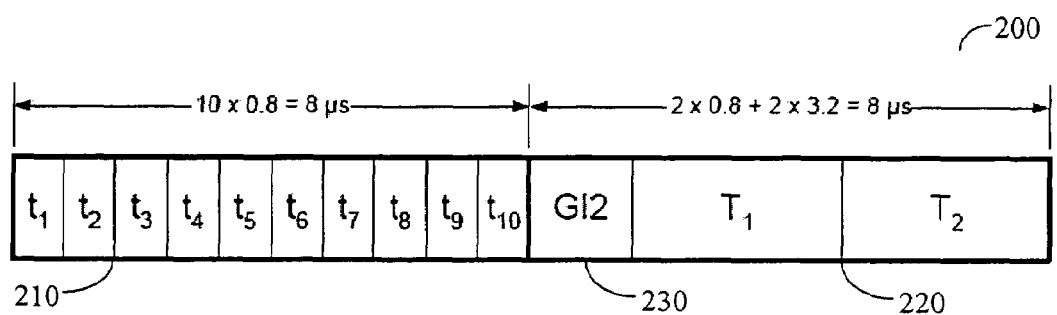
FIG. 2 is diagram illustrating a preamble of prior art OFDM signaling.
Figure 3:
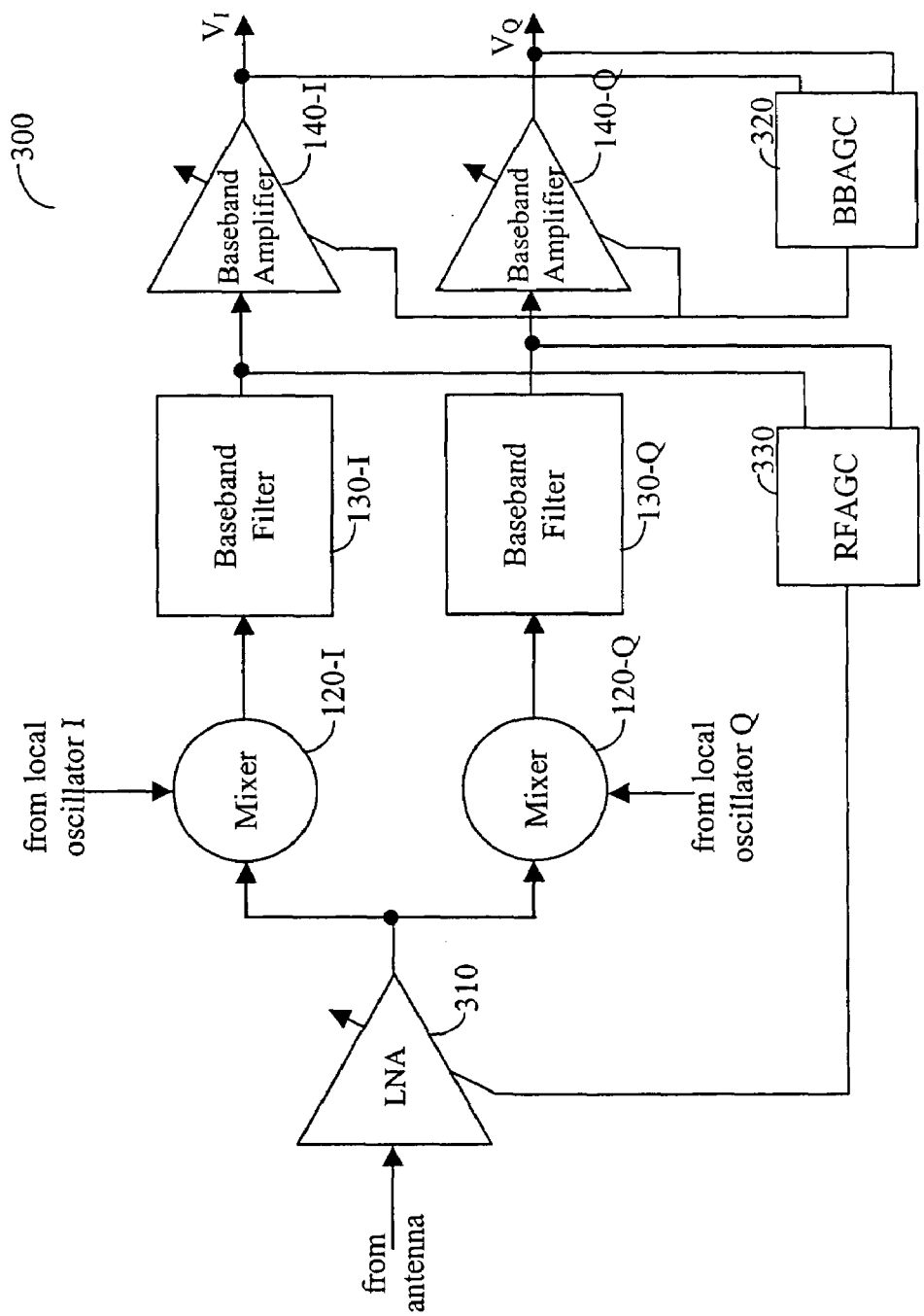
FIG. 3 is a schematic diagram of a two-stage AGC for an OFDM receiver.

Reference is now made to FIG. 3 where an exemplary schematic diagram of a two-stage AGC for an OFDM receiver 300 is shown. The receiver has a wireless input from an antenna and provides as an output an "I" channel $V_I$ and a "Q" channel $V_Q$, typical of the operation of a direct-conversion differential receiver. A continuous gain controlled LNA 310 receives the signal from the antenna (not shown) and provides its output signal to two mixers, mixer 120-I and mixer 120-Q, handling the "I" channel and the "Q" channel respectively. It is possible to control the amplification of LNA 110 by the use of an AGC circuit, as explained in more detail below. Mixers 120-I and 120-Q receive as inputs local oscillator (LO) frequencies respective of the "I" channel and the "Q" channel and output an appropriate baseband frequency. The baseband frequencies from mixers 120-I and 120-Q are used as an input to baseband filters (BBF) 130-I and 130-Q respectively. The function of a BBF, for example BBF 130-I, is to allow passing of only the frequencies respective of the "I" channel and prevent the passing of other ranges of frequencies.

The output of both BBF 130-I and 130-Q are fed into a radio frequency AGC (RFAGC) unit 330 which outputs a control signal which is used to control the amplification level of LNA 110. A more detailed description of the RFAGC 330 circuit is provided below. The output of each of BBF 130-I and 130-Q is fed as an input to a respective baseband amplifier (BBA) 140-I and 140-Q, the output of which provides the respective signals $V_I$ and $V_Q$. Both BBAs 140-I and 140-Q have the ability to control their respective amplification through a control input that is used by an AGC circuit as may be necessary. The signals $V_I$ and $V_Q$ are also fed into a baseband AGC (BBAGC) unit 320 designed to handle the amplification of both BBAs, namely BBAs 140-I and 140-Q, by providing the appropriate signal to their respective amplification control signal inouts. A more detailed description of the BBAGC 320 circuit is provided below. By splitting the AGC units as disclosed above, a faster and more accurate AGC function is provided and therefore a more sensitive OFDM receiver.

Figure 4:
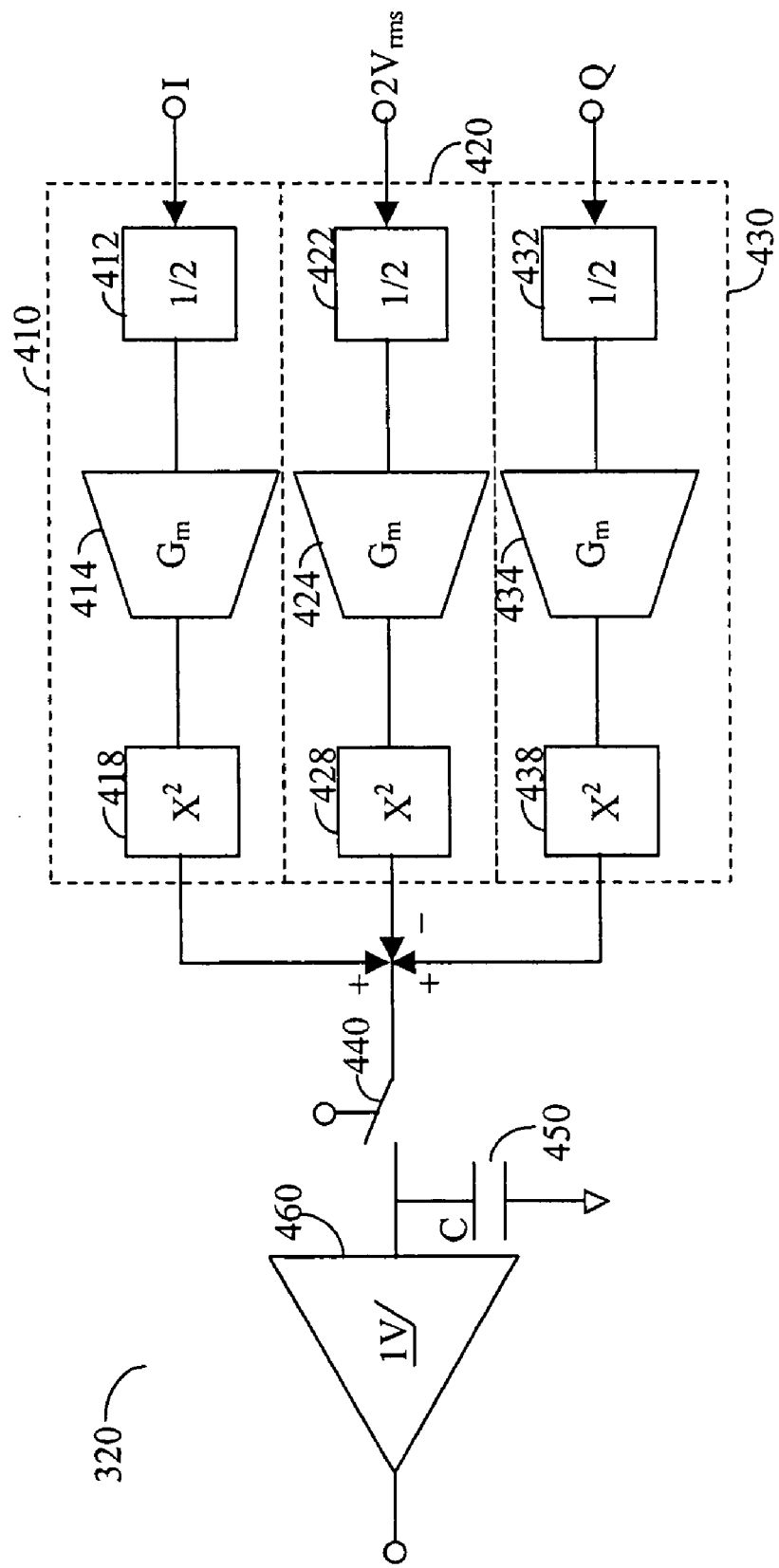
FIG. 4 is a detailed schematic diagram of an AGC unit in accordance with an embodiment of the present invention.

Reference is now made to FIG. 4 where an exemplary schematic diagram of an AGC unit, for example BBAGC 320 or RFAGC unit 330, is shown. For the purpose of the following discussion, reference is made to BBAGC 320. However this discussion is similarly valid for RFAGC 330. BBAGC unit 320 is comprised of three root mean square (rms) detectors 410, 420 and 430, the outputs of which are fed into a unity gain-limiting amplifier (UGLA) 460. Each of the rms detectors 410, 420 and 430 are further comprised of a divide-by-two attenuator (412, 422, and 432 respectively), a transconductor (414, 424 and 434 respectively), and a current squarer (418, 428, and 438 respectively). The output currents of rms detectors 410 and 430, that are connected to the signal paths "I" and "Q" respectively, are summed together, while the current of rms detector 420, connected to the reference value, is subtracted from the sum of the output currents of rms detectors 410 and 430. The resultant current is fed, through MOS switch 440, into external capacitor 450. When the AGC is enabled, MOS switch 440 is closed and an integration of the current takes place. When the AGC is disabled, capacitor 450 stores, or maintains, its previous value. Through this kind of control, it is possible to determine the level of the AGC necessary during the preamble period, and thereafter maintain the required level of AGC during the data reception period without further impact to the receiving paths.

A person skilled in the art would note that during the period when the AGC is active, the voltage across of capacitor 450 is determined as follows:

$$V_{AGC} = \frac{G_m^2}{4C}\left(\int_0^{T_{AGC}} I^2 dt + \int_0^{T_{AGC}} Q^2 dt - 2\int_0^{T_{AGC}} V_{rms} dt\right) \equiv$$

$$\frac{G_m^2}{4C} T_{AGC}(\text{rms}(I) + \text{rms}(Q) - 2V_{rms})$$

where $T_{AGC}$ is the active duration of the AGC operation, for example, a portion of the preamble period.

The voltage $V_{AGC}$ discussed above is provided to the input of UGLA 460. If the composite rms value of the "I" and "Q" paths is smaller than 2V rms, i.e., (Rms(I)+Rms(Q)<2Vrms), the output of the limiting amplifier is maintained at 1V. Doing this forces a BBA, for example BBA 140-I, or LNA 110, as the case may be, to have its maximum gain; otherwise the gain of a BBA, for example BBA 140-I, or LNA 110 is reduced, as may be required by the specific measurements of the respective AGC unit 320 or 330, respectively. If at the input of LNA 310 the signal has a small power level, for example −90 dBm, then the result at the output of the three power detectors will be a composite rms value smaller than $2V_{rmsRF}$. Consequently the output of UGLA 460 of RFAGC 320 is maintained at 1V, forcing LNA 110 to be at its maximum gain. In the case of the BBA, i.e., BBAs 140-I and 140-Q, the composite rms value between their respective outputs is initially larger than $2V_{rmsBB}$. This happens because the maximum gain of the receiver chain is designed in such a way to ensure that with an input signal of −110 dBm, the composite rms value at BBAs outputs, i.e., between the outputs of BBAs 140-I and 140-Q, is equal to $2V_{rmsBB}$. Consequently, the output of UGLA 460 of BBAGC 320 is increased to a value larger than 1V, and as a result activating the baseband AGC loop. In response to this activation, the composite rms value at the BBAs output becomes equal to $2V_{rmsBB}$. Notably, as the input signal power increases, the gain of BBAs 140-I and 140-Q decreases. The input signal to the BBAs, for example BBA 140-I, increases and the output composite rms value is locked to $2V_{rmsBB}$ as a result of the activation of the AGC loop using BBAGC 320.

RFAGC 330 operates in a similar way. When the composite rms output value of BBFs 130-I and 130-Q reaches the limit of $2V_{rmsRF}$, the output of UGLA 460 of RFAGC 330 is increased to a value exceeding 1V. As a result, the RF AGC loop is activated, forcing the composite rms value at the BBFs output to become equal to $2V_{rmsRF}$, while the gain of BBAs 140-I and 140-Q remains constant. A person skilled in the art would note that it is critical that the AGC loops closed by BBAGC 320 and RFAGC 330, complete the AGC cycle within the short duration of the preamble for a given wireless standard. This may be in contradiction with the need to have capacitor C 450 be sufficiently large to provide the necessary level of filtering and hold capabilities, as explained in more detail above. A typical value for capacitor C 450 is therefore set at 350 pF.

It should be noted that the power detector and associated circuitry responsive to the fixed input voltage may instead simply be a fixed current source providing a current to the summing point equivalent to what the power detector and associated circuitry responsive to the fixed input voltage would have done, i.e., a reference current. In that regard, currents may be summed by merely connecting the current sources together, so that the fixed current source providing a current to the summing point equivalent to what the power detector and associated circuitry responsive to the fixed input voltage would have done may in fact be a current sink removing the equivalent current from the summing point to effect the subtraction indicated. However this current is generated, the summing point provides an output current responsive to the sum of the I and Q current components responsive to the I and Q power levels, minus the magnitude of the third current, however generated.

Figure 5:
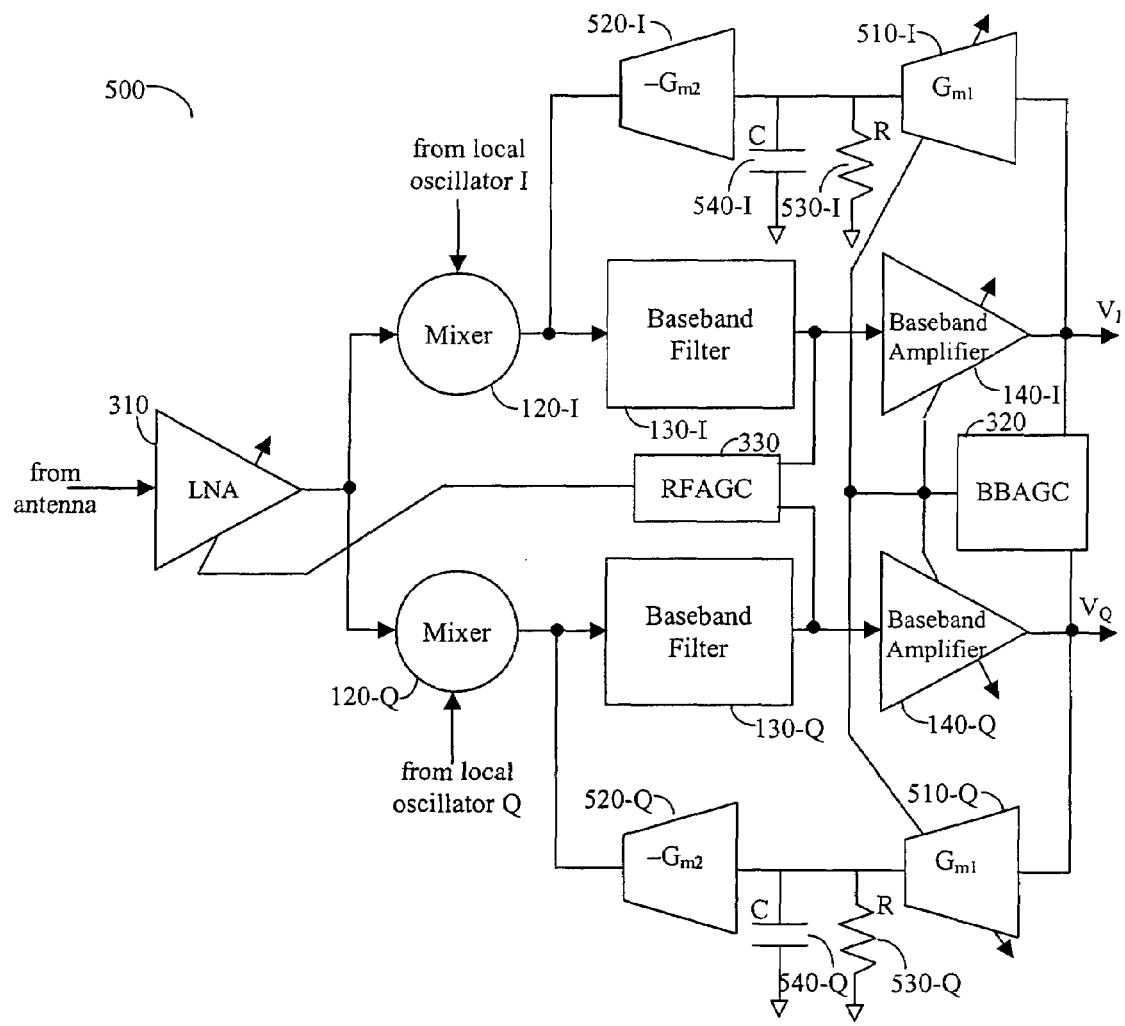
FIG. 5 is a detailed schematic diagram of a two-stage AGC and DC offset cancellation for an OFDM receiver in accordance with the present invention.

Reference is now made to FIG. 5 where an exemplary schematic diagram of a two-stage AGC and DC offset cancellation for an OFDM receiver 500 is shown. A detailed explanation of the operation of a DC offset cancellation circuit can be found in a US patent application titled "Apparatus and Methods for Eliminating DC Offset in a Wireless Communication Device" by S. Piplos, assigned to common assignee and filed on the same day and date, and which is hereby incorporated by reference for all that it contains. In addition to the elements of the circuit described in more detail in FIG. 3 above, there are added two DC offset cancellation circuits to handle the "I" and "Q" channels of OFDM receiver 500. The analysis hereinafter in respect to the "I" channel but is equally valid to the "Q" channel of OFDM receiver 500. A feedback loop comprising transconductor amplifiers 510-I and 520-I having a gain of $G_{m1}$ and $-G_{m2}$, respectively, is connected between the output of BBA 140-I, i.e., $V_I$, and the input of BBF 130-I. Transconductor amplifier 510-I further feeds a parallel combination of a resistor (R) 530-I and a capacitor (C) 540-I coupled to a reference voltage, typically a circuit ground. Transconductor amplifier 520-I multiples the signal developed across of the R-C combination by its gain $-G_{m2}$, and produces a current that, because of its reverse nature, is in fact equivalent to subtraction from the current output from mixer 120-I, the current differential being fed into BBF 130-I. At low frequencies, capacitor 540-I of the DC servo loop, behaves as an open circuit and therefore can be ignored. The signal that is output from transconductor amplifier 510-I is passed through resistor 530-I and develops a proportionate voltage, which is then fed into transconductor amplifier 520-I. Hence, the overall gain for DC and frequencies close to DC from the input to BBF 130-I to the output of BBA 140-I, is essentially zero. At high frequencies, capacitor 540-I behaves practically as a short circuit, effectively shorting the signal at the output of transconductor amplifier 510-I to ground. As a result, transconductor amplifier 520-I has almost no signal at its input and produces almost no signal at its output. Hence, the overall gain for relatively high frequencies from the input to BBF 130-I to the output of BBA 140-I, is essentially the gain achieved by moving the signal through BBF 130-I and BBA 140-I.

The transresistance gain of the DC servo loop, comprised of transconductor amplifiers 510-I and 520-I, is significantly low at and around zero frequencies (DC) and significantly high at signal frequencies. For in-between frequencies the gain varies from the lowest gain value to the highest gain value. The "corner" frequencies $f_z$ and $f_p$, i.e., those frequencies where the gain begins to change from the lowest frequency and the highest frequency respectively, are also known as a "zero" frequency, and a "pole" frequency, respectively. The frequency of $f_z$ for the exemplary embodiment can be shown to be:

$$f_z = \frac{1}{2\pi RC}$$

and $f_p$ can be shown to be:

$$f_p = f_z \times \frac{H_{SIGNAL}}{H_{DC}} = f_z \times R_{mFILTER} \times A_{BB} \times G_{m1} \times R \times G_{m2}$$

Therefore, $f_z$ is, in the first instance, constant and can be set to a desired value for optimum system operation. However, $f_p$ is proportional to BBA 140-I gain that is not constant, but rather varies through the action of the AGC, depending on the amplitude of the signal received, and as explained in more detail above. This means that as the signal strength varies, so will $f_p$. Such behavior can lead to suboptimal operation of OFDM receiver 500. Another problem that can arise is that if $f_p$ increases too much, the associated signal path phase shift, in combination with the phase shifts in other paths of the system (e.g., BBF 130-I), can reach 180 degrees at some frequency, which is equivalent to multiplication of the signal by a minus sign; the overall feedback can then change from negative to positive, and this can lead to undesired oscillations. To eliminate this potential, transconductor amplifier 410 gain may be designed to respond to the same AGC signal as BBA 140-I, and to vary in inverse proportion to the varying gain $A_{BB}$ of BBA 140-I, thus maintaining the value of $f_p$ constant. Such a configuration is shown in FIG. 5, where the output of BBAGC 320 controls not only the amplification of BBA 140-I bit, but also the amplification of transconductor amplifier 510-I, in the manner explained above. In another embodiment of the disclosed invention a switch is used to activate and deactivate the DC servo function, allowing to restrict its operation to desired periods of time, for example the preamble period.

Figure 6:
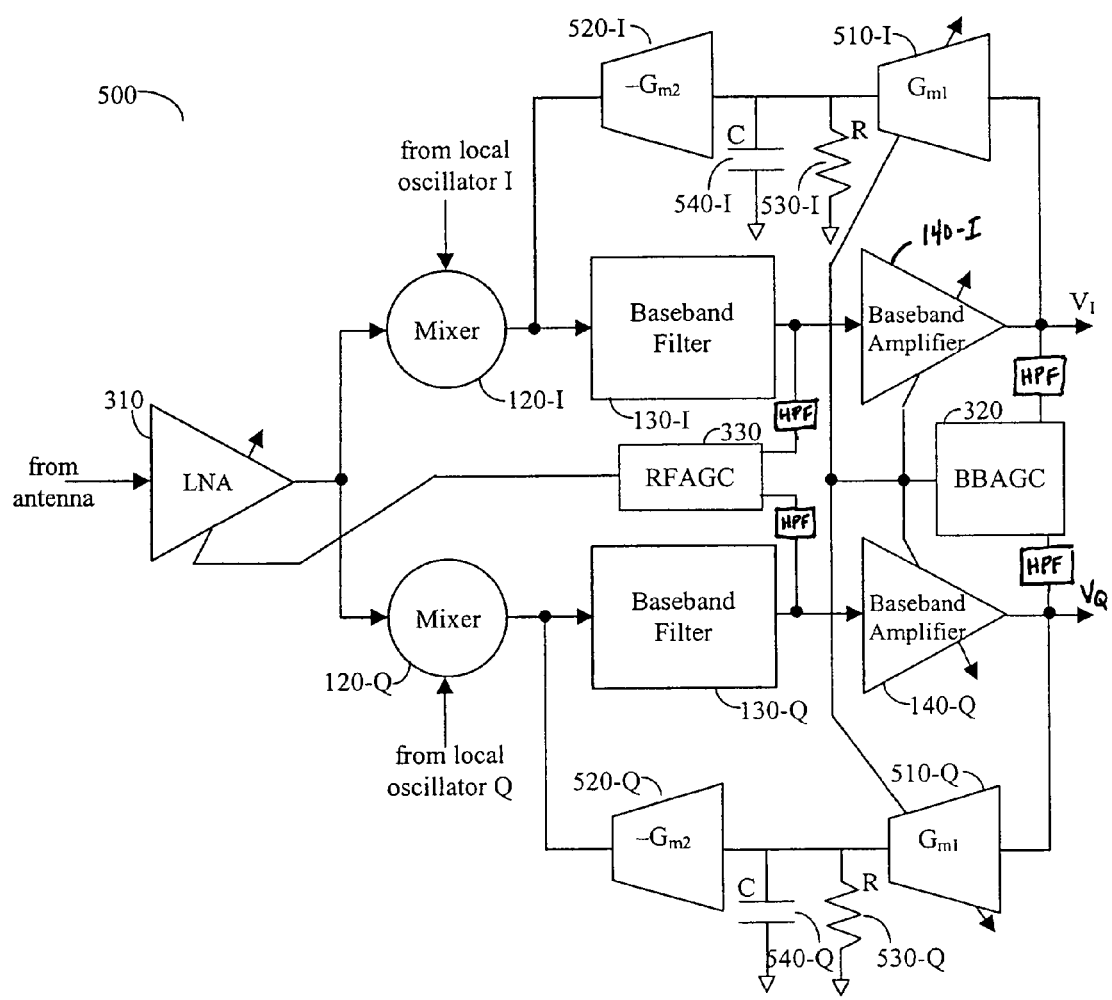
FIG. 6 is a schematic diagram similar to that of FIG. 5, but showing high pass filters at the inputs of the AGC circuits.

In another embodiment of the disclosed invention shown in FIG. 6, the AGC circuits have at their input a high pass filter HPF, used to prevent the entry of low frequencies, and specifically DC, resulting from the output DC offset at the $V_I$ and $V_Q$ outputs. An OFDM training symbol consists of 12 sub-carriers (±4, ±8, ±12, ±16, ±20 and ±24 with 312.5 KHz of spacing for 802.11a, and ±2, ±6, ±10, ±14, ±18 and ±22 with 312.5 KHz of spacing for Hiperlan2). As there is no DC content in the spectral range but there is a DC offset error, it leads to an additional error in the AGC functionality. Hence, the high pass filter prevents this error from occurring. However, its corner frequency impacts the performance of the circuit. Therefore, in another embodiment of the disclosed invention, the corner frequency of the high pass filter is set to a first high frequency, for example 1,862 KHz, during a first period of the preamble, for example for a period of 4 microseconds, and thereafter the corner frequency is switched to a second lower frequency, for example 266 KHz. The high and low frequencies are based on simulation results and may vary depending on the specific characteristics of the circuits used. The objective though, is to obtain an initial very fast AGC loop response times, at the expense of precision. The switching to the lower frequency, for example 266 KHz, occurs once the DC servo loop has settled, or almost settled, while the AGC loops have reached a state very close to their final state. Thereafter, the AGC loops continue their operation with increased precision, as practically no filtering of the signal spectrum occurs.

Thus in accordance with preferred embodiments of the present invention, the AGC loops and the DC offset compensation loops may be substantially decoupled. Also, for moderate to high received RF signal strength, the AGC loops settle with the required system gain based on the AGC loop controlling the gain of LNA 310. In this case, the gain of the baseband amplifiers will settle to a substantially fixed, low gain, independent on variations in the moderate to high received RF signal strength. However when the received RF signal strength falls below some limit, the LNA 310 will not be able to maintain the output of the baseband filters, and accordingly the input to the baseband amplifiers will decrease, and vary with the variations in the weak received RF signal strength. Now the gain of the LNA 310 will remain at its maximum, and the baseband amplifier AGC loop will control the baseband amplifier gain to at least maintain the output voltages $V_I$ and $V_Q$.

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features as desired.

What is claimed is:

1. A wireless receiver having a two-stage automatic gain control (AGC) comprising:
   a low-noise amplifier (LNA) capable of receiving a wireless signal from an antenna, and further having a controllable amplification;
   a first mixer connected to an output of said LNA coupled to receive a first local oscillator (LO) signal and output a first baseband signal;
   a second mixer connected to the output of said LNA, coupled to receive a second LO signal and output a second baseband signal;
   a first baseband filter (BBF) connected to the output of said first mixer;
   a second baseband filter (BBF) connected to the output of said second mixer;
   a radio frequency AGC (RFAGC) circuit receiving as inputs at least an output signal of said first BBF and an output signal of said second BBF, said RFACG having an output coupled in a first closed loop to control the amplification of said LNA;
   a first baseband amplifier (BBA) coupled to receive the output of said first BBF;
   a second baseband amplifier (BBA) coupled to receive the output of said second BBF;
   a baseband AGC (BBAGC) circuit receiving as inputs at least an output signal of said first BBA and an output of said second BBA, said BBAGC being coupled in a second closed loop to control the amplifications of at least said first BBA and said second BBA; wherein said first and second closed loops of said AGC circuits are active during at least part of the preamble period of an orthogonal frequency division multiplexing (OFDM) transmission, said closed loops being opened thereafter, and further comprising AGC signal storage devices to retain the inputs to said AGC circuits after said closed loops are opened.

2. A wireless receiver having a two-stage automatic gain control (AGC) comprising:
   a low-noise amplifier (LNA) capable of receiving a wireless signal from an antenna, and further having a controllable amplification;
   a first mixer connected to an output of said LNA coupled to receive a first local oscillator (LO) signal and output a first baseband signal;
   a second mixer connected to the output of said LNA, coupled to receive a second LO signal and output a second baseband signal;
   a first baseband filter (BBF) connected to the output of said first mixer;
   a second baseband filter (BBF) connected to the output of said second mixer;
   a radio frequency AGC (RFAGC) circuit receiving as inputs at least an output signal of said first BBF and an output signal of said second BBF, said RFACG having an output coupled in a first closed loop to control the amplification of said LNA;
   a first baseband amplifier (BBA) coupled to receive the output of said first BBF;
   a second baseband amplifier (BBA) coupled to receive the output of said second BBF;
   a baseband AGC (BBAGC) circuit receiving as inputs at least an output signal of said first BBA and an output of said second BBA, said BBAGC being coupled in a second closed loop to control the amplifications of at least said first BBA and said second BBA;
   said RFAGC and said BBAGC each comprise:
   a first power detector receiving a first input signal and having a current output;
   a second power detector receiving a second input signal and having a current output;
   circuitry providing a reference current output;
   current summing means for combining a current output of said first power detector, a current output of said second power detector and said reference current output to provide a summing means current output responsive to the sum of said current output of said first power detector and said current output of said second power detector, minus the magnitude of the reference current output;
   a unit gain limiting amplifier (UGLA); and,
   a capacitor connected to the input of said UGLA, capable of receiving the output current from said current summing means.

3. The wireless receiver of claim 2, wherein said first input signal of said RFAGC is connected to the output of said first BBF and said second input signal of said RFAGC is connected to the output of said second BBF.

4. The wireless receiver of claim 2, wherein said first input signal of said BBAGC is connected to the output of said first BBA and said second input signal of said BBAGC is connected to the output of said second BBA.

5. The wireless receiver of claim 2, wherein said reference current for said RFAGC corresponds to twice the current output of each of the first and second power detectors for said RFAGC for a predetermined radio frequency root mean square voltage output of each of the first and second BBFs.

6. The wireless receiver of claim 5, wherein said UGLA is capable of maintaining the output of said UGLA at a predetermined minimum voltage if the sum of the current outputs of the first and second power detectors exceeds the reference current for said RFAGC.

7. The wireless receiver of claim 6 wherein said predetermined minimum voltage is one volt.

8. The wireless receiver of claim 2, wherein said reference current for said BBAGC corresponds to twice the current output of each of the first and second power detectors for said BBAGC for a predetermined radio frequency root mean square voltage output of each of the first and second BBAs.

9. The wireless receiver of claim 8, wherein said UGLA maintains the output of said UGLA at a predetermined minimum voltage if the sum of the current outputs of the first and second power detectors for said BBAGC exceeds said reference current for said BBAGC.

10. The wireless receiver of claim 9 wherein said predetermined minimum voltage is one volt.

11. The wireless receiver of claim 2, wherein each said power detector further comprises:
    a transconductor amplifier; and,
    means for performing a squaring function on an input current, said means for performing said squaring function being coupled to the output of said transconductor amplifier.

12. The wireless receiver of claim 11 wherein said circuitry providing a reference current output comprises a third power detector receiving a reference voltage input and having a current output, each power detector having a dividing means dividing the respective input voltage to the power detector by two, the input to the third power detector being $2 V_{rms}$.

13. The wireless receiver of claim 12, wherein each said dividing means comprises an attenuator.

14. The wireless receiver of claim 2, wherein at least one of said RFAGC and said BBAGC further comprises:
switching means connected between said current summing means and said capacitor.

15. The wireless receiver of claim 14, wherein said switching means enable said capacitor charging during at least a portion of the preamble of an OFDM transmission.

16. The wireless receiver of claim 2, wherein at least one of said RFAGC and said BBAGC further comprises high pass filter means connected at the input of said at least one of said RFAGC and said BBAGC.

17. The wireless receiver of claim 16, wherein said high pass filter operates at a first corner frequency during a first period and at a second lower corner frequency during a second period of operation.

18. The wireless receiver of claim 17, wherein said first corner frequency is 1,826 kilohertz.

19. The wireless receiver of claim 17, wherein said second corner frequency is 266 kilohertz.

20. The wireless receiver of claim 17, wherein said first period is an initial period of a preamble period of an OFDM transmission.

21. The wireless receiver of claim 20, wherein said second period is subsequent to said initial period within said preamble period of an OFDM transmission.

22. A wireless receiver having a two-stage automatic gain control (AGC) comprising:
a low-noise amplifier (LNA) capable of receiving a wireless signal from an antenna, and further having a controllable amplification;
a first mixer connected to an output of said LNA, coupled to receive a first local oscillator (LO) signal and output a first baseband signal;
a second mixer connected to the output of said LNA, coupled to receive a second LO signal and output a second baseband signal;
a first baseband filter (BBF) connected to the output of said first mixer;
a second baseband filter (BBF) connected to the output of said second mixer;
a radio frequency AGC (RFAGC) circuit receiving as inputs at least an output signal of said first BBF and an output signal of said second BBF, said RFACG having an output coupled in a first closed loop to control the amplification of said LNA;
a first baseband amplifier (BBA) coupled to receive the output of said first BBF;
a second baseband amplifier (BBA) coupled to receive the output of said second BBF;
a baseband AGC (BBAGC) circuit receiving as inputs at least an output signal of said first BBA and an output of said second BBA, said BBAGC being coupled in a second closed loop to control the amplifications of at least said first BBA and said second BBA;
said wireless receiver further comprising:
a first DC offset cancellation circuit connected between the output of said first BBA and the input of said first BBF; and,
a second DC offset cancellation circuit connected between the output of said second BBA and the input of said second BBF.

23. The wireless receiver of claim 22, wherein each of said first and second DC offset cancellation circuits further comprise:
a transconductor amplifier receiving an input signal;
a resistor connected to the output of said transconductor amplifier;
an inverting transconductor amplifier connected to the output of said transconductor amplifier providing an output current; and,
a capacitor connected to the input of said inverting transconductor amplifier.

24. The wireless receiver of claim 23, wherein each of said DC offset cancellation circuits further comprises switching means connected between the output of said transconductor amplifier and the input of said inverting transconductor amplifier.

25. The wireless receiver of claim 24, wherein each said switching means enables a DC servo loop during at least a portion of the preamble period of an OFDM transmission.

26. The wireless receiver of claim 23, wherein the amplification of said transconductor amplifier is controlled by said BBAGC.

27. A two-stage automatic gain control (AGC) for an orthogonal frequency division multiplexing (OFDM) receiver, comprising:
means for determining the average power of received preamble symbols in order to set an appropriate baseband AGC (BBAGC) level for a "Q" channel baseband amplifier (BBA) and an "I" channel BBA of said OFDM receiver, said means for determining the average power being coupled to receive inputs from an "I" channel and a "Q" channel of said OFDM receiver; and,
means for determining the average power of received preamble symbols in order to set an appropriate radio frequency AGC (RFAGC) level of a low-noise amplifier of said OFDM receiver:
said means for determining the average power comprising:
a first power detector receiving a first input signal from said "I" channel;
a second power detector receiving a second input signal from said "Q" channel;
a current source providing a reference current;
current summing means for adding the current output of said first power detector and the current output of said second power detector and further subtracting the reference current;
a unit gain limiting amplifier (UGLA); and,
a capacitor connected to the input of said UGLA, capable of receiving the output current from said current summing means.

28. The two-stage AGC of claim 27, wherein said first input signal for the "I" channel for said BBAGC is provided from the output of said "I" channel BBA and said second input signal for the "Q" channel for said BBAGC is provided from the output of said "Q" channel BBA.

29. The two-stage AGC of claim 27, wherein said first input signal for the "I" channel for said RFAGC is provided from the output of an "I" channel baseband filter (BBF) and said second input signal for the "Q" channel for said RFAGC is provided from the output of a "Q" channel BBF.

30. The wireless receiver of claim 27, wherein each said power detector further comprises:
a transconductor amplifier; and,
means for performing a squaring function on an input current, said means for performing said squaring function being coupled to the output of said transconductor amplifier.

31. The wireless receiver of claim 30 wherein said circuitry providing a reference current output comprises a third power detector receiving a reference voltage input and having a current output, each power detector having a dividing means dividing the respective input voltage to the power detector by two, the input to the third power detector being 2 $V_{rms}$.

32. The wireless receiver of claim 31, wherein each said dividing means comprises an attenuator.

33. A two-stage automatic gain control (AGC) for an orthogonal frequency division multiplexing (OFDM) receiver, comprising:
    means for determining the average power of received preamble symbols in order to set an appropriate baseband AGC (BBAGC) level for a "Q" channel baseband amplifier (BBA) and an "I" channel BBA of said OFDM receiver; and,
    means for determining the average power of received preamble symbols in order to set an appropriate radio frequency AGC (RFAGC) level of a low-noise amplifier of said OFDM receiver;
    said BBAGC level further controlling the amplification of a transconductor amplifier of a DC offset cancellation circuit of said OFDM receiver.

34. The two-stage AGC of claim 27, wherein each of said means for determining the average power further comprises switching means connecting between said current summing means mid said capacitor.

35. The two-stage AGC of claim 34, wherein said switching means enables charging of each capacitor during at least a portion of the preamble of an OFDM transmission.

36. The two-stage AGC of claim 27, wherein said reference current for said BBAGC corresponds to twice the current output of each of the first and second power detectors for said BBAGC for a predetermined radio frequency root mean square voltage output of each of the first and second BBAs.

37. The two-stage AGC of claim 36, wherein said UGLA maintains the output of said UGLA at a predetermined minimum voltage if the sum of the current outputs of the first and second power detectors for said BBAGC exceeds said reference current for said BBAGC.

38. The two-stage AGC of claim 37 wherein said predetermined minimum voltage is one volt.

39. A method for the determination of AGC levels of an OFDM receiver having an "I" channel and a "Q" channel, the method comprising:
    generating a first AGC control signal to a first and second baseband amplifiers based at least on determining the average power of a received sequence of preamble symbols in order to set an appropriate baseband AGC level for said first and second baseband amplifiers; and,
    generating a second AGC control signal based at least on determining the average power of said received sequence of preamble symbols in order to set an appropriate radio frequency AGC level of a low-noise amplifier of said OFDM receiver;
    wherein generating a first AGC control signal comprises:
    determining a first voltage proportional to the square of an "I" channel output of the first baseband amplifier during said received sequence of preamble symbols;
    determining a second voltage proportional to the square of a "Q" channel output of the second baseband amplifier during said received sequence of preamble symbols;
    determining a third voltage proportional to the square of a reference voltage;
    determining the output voltage by adding said first voltage and second voltage and subtracting from the result said third voltage;
    averaging the output voltage over at least part of a time of said sequence of preamble symbols; and,
    maintaining said first AGC control signal at a value corresponding to the average of the output voltage, but not more than a minimum value if the averaged output voltage is less than a predetermined value.

40. The method of claim 39, wherein said method further comprises:
    providing said AGC control signal to at least a transconducting amplifier for the purpose of controlling the gain of said transconducting amplifier.

41. A wireless receiver having a two-stage automatic gain control comprising:
    a low-noise variable gain amplifier coupled to receive an RF signal from an antenna;
    first and second mixers connected to an output of the low noise amplifier;
    first and second baseband filters connected to the outputs of said first and second mixers, respectively;
    first and second baseband amplifiers coupled to receive an output of a respective baseband filter;
    a first AGC circuit responsive to the output of the baseband filters to control the gain of the low noise amplifier; and,
    a second AGC circuit responsive to the output of the baseband amplifiers to control the gain of the baseband amplifiers;
    wherein the first and second AGC circuits are responsive to the power level of the respective outputs to which the first and second AGC circuits are responsive
    each AGC circuit including a reference current source, the first and second AGC circuits including first and second power detectors providing current outputs responsive to the power level of the respective outputs to which the first and second AGC circuits are responsive, the difference between the sum of the outputs of the respective power detectors and the respective reference current being coupled to a capacitor, the voltage on the capacitor being coupled to control the gain of the amplifier controlled by the respective AGC circuit.

42. The wireless receiver of claim 41 for receiving OFDM signals wherein each AGC circuit further comprises a switch, the difference between the sum of the outputs of the respective power detectors and the respective reference current being coupled through the switch to the capacitor during at least part of an OFDM preamble time, the switch otherwise being open.

43. A wireless receiver having a two-stage automatic gain control comprising:
    a low-noise variable gain amplifier coupled to receive an RF signal from an antenna;
    first and second mixers connected to an output of the low noise amplifier;
    first and second baseband filters connected to the outputs of said first and second mixers, respectively;
    first and second baseband amplifiers coupled to receive an output of a respective baseband filter;
    a first AGC circuit responsive to the output of the baseband filters to control the gain of the low noise amplifier; and,
    a second AGC circuit responsive to the output of the baseband amplifiers to control the gain of the baseband amplifiers;
    wherein for RF signals that are relatively stronger, the first AGC circuit will maintain the outputs of the baseband filters at a predetermined level, with the second AGC circuit holding the gain of the baseband amplifiers at a relatively constant gain, and for RF signals that are relatively weaker, the first AGC circuit will hold the gain of the low noise amplifier at a maximum gain, with the second AGC circuit varying the gain of the baseband amplifiers in response to variations in the relatively weaker RF signals.

44. A wireless receiver having a two-stage automatic gain control comprising:
   a low-noise variable gain amplifier coupled to receive an RF signal from an antenna;
   first and second mixers connected to an output of the low noise amplifier;
   first and second baseband filters connected to the outputs of said first and second mixers, respectively;
   first and second baseband amplifiers coupled to receive an output of a respective baseband filter;
   a first AGC circuit responsive to the output of the baseband filters to control the gain of the low noise amplifier;
   a second AGC circuit responsive to the output of the baseband amplifiers to control the gain of the baseband amplifiers; and,
   a pair of DC offset compensation circuits, each DC offset compensation circuit being responsive to the output of a respective baseband amplifier and adding a DC compensating signal to the output of the respective mixer.

45. The wireless receiver of claim 44 wherein the DC compensation circuits are active during at least a part of an OFDM signal preamble, and thereafter each store a signal to subsequently maintain the respective DC compensation established when active.

46. The wireless receiver of claim 45 wherein the DC compensation circuits have a frequency response providing a relatively high gain feedback of low frequency and DC compensating signals and a relatively low gain feedback for frequencies of OFDM signals.

47. The wireless receiver of claim 46 wherein the signal to subsequently maintain the respective DC compensation is stored on a capacitor, and wherein the gain of the part of each DC compensation circuit between the output of a respective baseband amplifier and the capacitor is controlled by the second AGC circuit to be inversely proportional to the gain of the respective baseband amplifier.

48. The wireless receiver of claim 47 wherein each compensation circuit further comprises a switch disconnecting the capacitor from the part of each DC compensation circuit between the output of a respective baseband amplifier and the capacitor by the end of an OFDM signal preamble.

* * * * *